US006732787B1

(12) United States Patent
Trehan et al.

(10) Patent No.: US 6,732,787 B1
(45) Date of Patent: May 11, 2004

(54) CABINET UPGRADE SYSTEM FOR IN-SERVICE TELECOMMUNICATIONS CABINETS

(75) Inventors: Anil K. Trehan, Plano, TX (US); Alfred Wayne King, Plano, TX (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/386,007

(22) Filed: Mar. 10, 2003

(51) Int. Cl.[7] .............................................. F28F 15/00
(52) U.S. Cl. .................. 165/104.33; 165/122; 312/236; 361/724; 454/184
(58) Field of Search .......................... 165/122, 104.33; 312/236; 361/724; 454/184

(56) References Cited

U.S. PATENT DOCUMENTS

| | | | | | |
|---|---|---|---|---|---|
| 4,386,651 | A | * | 6/1983 | Reinhard | 165/104.33 |
| 4,679,867 | A | * | 7/1987 | Heldenbrand et al. | 312/287 |
| 4,777,565 | A | * | 10/1988 | McIntosh | 361/816 |
| 4,949,218 | A | * | 8/1990 | Blanchard et al. | 361/696 |
| 5,467,250 | A | * | 11/1995 | Howard et al. | 361/696 |
| 5,546,845 | A | * | 8/1996 | Wossner et al. | 89/35.01 |
| 5,812,373 | A | * | 9/1998 | Hwang | 361/704 |
| 6,142,595 | A | * | 11/2000 | Dellapi et al. | 312/326 |
| 6,164,369 | A | * | 12/2000 | Stoller | 165/104.33 |
| 6,170,562 | B1 | * | 1/2001 | Knoblauch | 165/104.33 |
| 6,225,554 | B1 | * | 5/2001 | Trehan et al. | 174/35 MS |
| 6,446,716 | B1 | * | 9/2002 | Marchal et al. | 165/253 |
| 2003/0085025 | A1 | * | 5/2003 | Woods et al. | 165/104.33 |

* cited by examiner

*Primary Examiner*—Terrell McKinnon
(74) *Attorney, Agent, or Firm*—Synnestvedt Lechner & Woodbridge, LLP; Richard C. Woodbridge, Esq.; Thomas J. Onka, Esq.

(57) ABSTRACT

A method and apparatus for upgrading in-service or legacy telecommunications cabinets that improves power, cooling, space and EMI capabilities, allowing the cabinet to house updated, telecommunications equipment. The upgrade modules include an extension collar that replaces legacy doors, allowing the attachment of replacement doors having integral heat exchanger units. The extension collar also has support for Electro-magnetic Interference (EMI) shielding gaskets so provide EMI shielding capable of meeting FCC mandated levels. Additional upgrade modules include a battery chamber attached beneath the base of legacy cabinet, cooled and vented by one or more of the heat exchanger doors, thereby providing longer battery life.

17 Claims, 8 Drawing Sheets

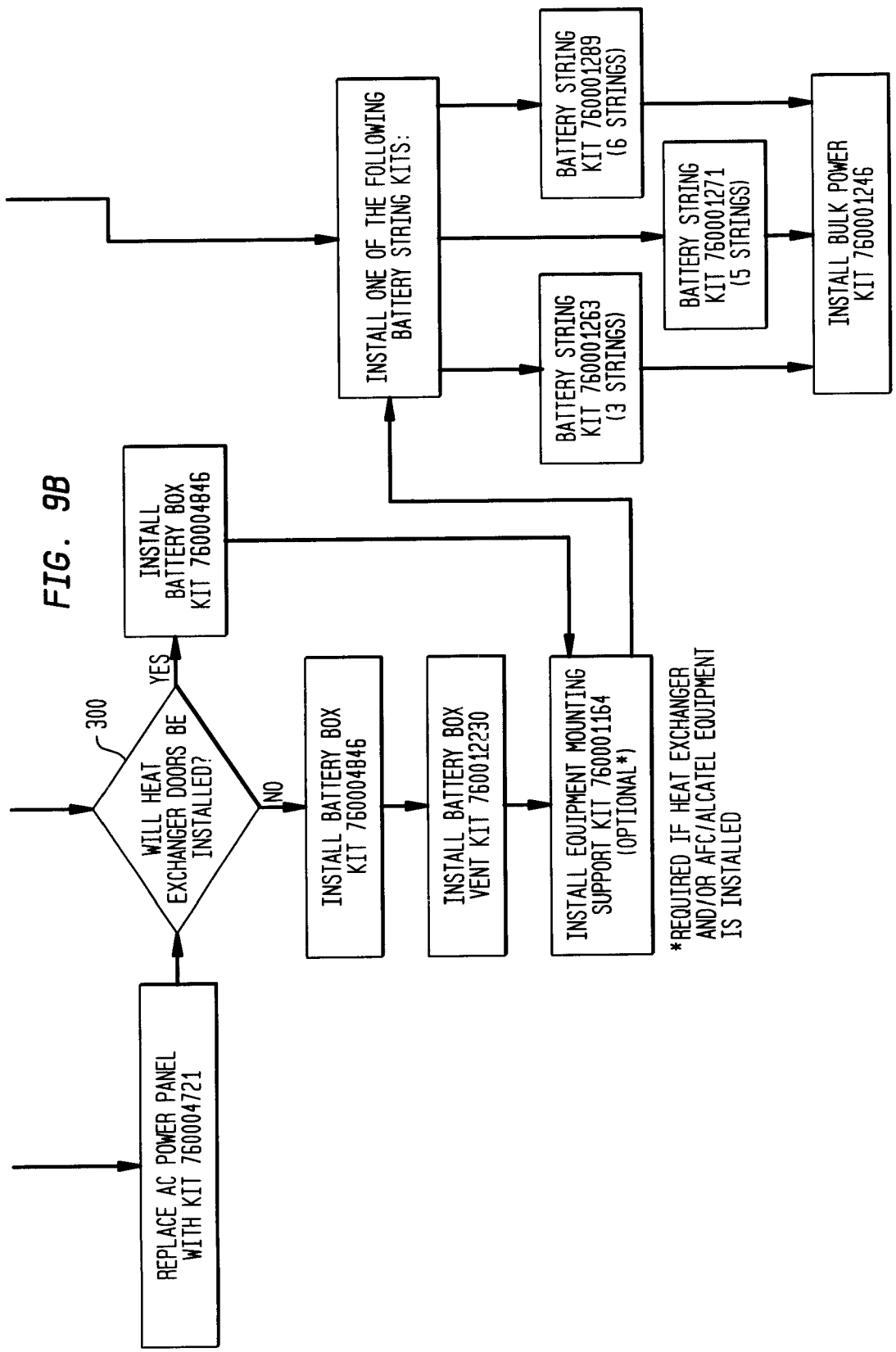

CABINET UPGRADE SYSTEM FOR IN-SERVICE TELECOMMUNICATIONS CABINETS

FIELD OF THE INVENTION

The present invention relates to systems and apparatus for telecommunications cabinets and particularly to systems and apparatus for upgrading inservice telecommunications cabinets.

BACKGROUND OF THE INVENTION

During deregulation of the telecommunications industry in the early 1980's many thousands of telecommunications cabinets were installed to support the expansion of the phone network. These cabinets were typically placed near urban developments by the telephone companies to provide local access and contained telecommunications equipment.

Since the initial installation and population of these cabinets, telecommunications equipment has advanced. In particular, phone systems have evolved to provide significantly higher line density. In order to provide adequate voice and data systems to their urban customers, local access providers and Incumbent Local Exchanger Carriers (ILEC) need to upgrade the equipment in the local telecommunications cabinets with state of the art equipment, including, but not limited to, Digital Loop Carrier (DLC), and Digital Subscriber Loop systems (xDSL). However, they face a number of problems. The new equipment has greater line density and it requires more power, cooling and space than existing cabinets can provide. The new equipment also emits significantly more electromagnetic radiation than the old equipment and may violate FCC regulations on EMI emissions if run in existing cabinets. In addition, most of the existing or legacy cabinets can only accommodate electronics racks that are twelve inches or less in depth. Some of newer electronics racks are more than thirteen inches in depth and therefore they cannot fit in legacy cabinets.

Replacing the existing telecommunications cabinets with new ones designed to accommodate the need for greater line density, and increased power, cooling, space and EMI requirements of the new equipment is a problem too. If a cabinet is removed and replaced, a new right of way is required. This is both costly and time consuming, especially in more densely populated areas like the North Eastern United States, where many municipalities and townships have become significantly more resistant to any form of development.

Moreover, if a new cabinet is installed, there has to be continuity of service to existing customers during the installation. In a new installation, this is usually accomplished by first transferring all the lines to a mirror set of telecommunications equipment in a trailer. After the new cabinet is set up, the lines are then all transferred back to the new cabinet. This procedure is both very costly and time consuming.

What is needed is a way to utilize the existing cabinets and their existing rights of way, by upgrading the legacy cabinets to be capable of accommodating the new equipment requirements. This upgrade should not only be cost effective, but should preferably be able to be done with minimal disruption of service.

SUMMARY OF THE INVENTION

The present invention is a cabinet upgrade system for in-service or legacy telecommunications cabinets that improves the existing cabinet's power, cooling, space and EMI capabilities, thereby allowing the cabinet to be used to house updated telecommunications equipment.

In one embodiment, the invention includes an extension collar that fits on the legacy cabinet in place of the legacy doors. The extension collar allows the attachment of replacement doors that have heat exchanger units integrated into them. The extension collar also has suitable flanges to accept Electro-magnetic Interference (EMI) gaskets and so provide EMI shielding capable of meeting standards, such as but not limited to Federal Communications Commission (FCC) mandated levels. The extension collar also has suitable flanges to accept weather or environmental gaskets and so provide protection from the elements.

In the preferred embodiment of the invention the replacement doors are heat exchanger doors. The doors have one or more sets of fans, or other air moving means, incorporated into them. The purpose of the fans is to set up two sets of air circulation, one using internal air and one using external air. Both air circulations flow past a common heat-conducting, heat-exchanger partition. By this means heat from within the cabinet is transferred out into the surrounding atmosphere without any exchanger of air and the associated problems of filtering that air exchanger necessitates.

Many legacy cabinets are raised off the ground by up to fourteen inches or so. This is done to avoid flooding of the equipment compartment. One embodiment of the invention takes advantage of the resultant space beneath legacy cabinets to accommodate a bulk power upgrade in the form of a battery chamber. As part of the upgrade to the cabinet, a battery chamber is fitted beneath the base of legacy cabinet. Batteries are indifferent to flooding, so long as the water does not reach the terminals, which are located at the top of the battery chambers and close to the base of the legacy equipment compartment base. The heat exchanger doors are constructed to extend down below the base of the cabinet's equipment compartment and have inlet vents that draw in air from beneath the level of the legacy cabinet equipment compartment base. Furthermore, one of the doors' external air inlets is directed so as to draw air through the upgrade battery cabinet. This allows both cooling and venting of the battery chamber, both of which contribute to longer battery life. Having one door draw external air through the battery chamber while the other draws air in from vents directed away from the chamber ensures that there is enough, but not too much air drawn through the battery compartment. Too much air might result in dust being drawn into the battery compartment.

DETAILED DESCRIPTION

The present invention will now be described with reference to the drawings in which like numbers are used to describe like elements.

Figure 1:
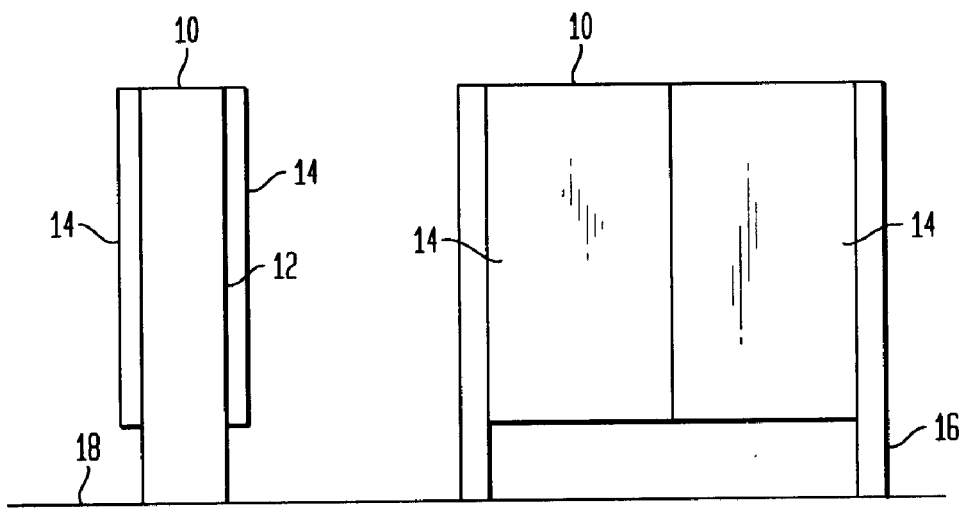
FIG. 1 shows a front and side elevation of a typical legacy telecommunications cabinet.

FIG. 1 shows two elevations of a legacy telecommunications cabinet 10, having a body 12 and four doors 14. These cabinets are typically constructed from aluminum or galvanized steel, and have an outer coat of paint. The cabinet body 12 has means for holding and supporting racks of electronic equipment and is raised off the ground-line 18 by end supports 16. Typical legacy telecommunications cabinet 10 include, but are not limited to, cabinets such as Avaya's 80C-DP, 80D-DP, 80E-DP, 80A-BP and 80D-BP cabinets as well as similar cabinets made by other telecommunications manufacturers. The cabinets have to be extremely well designed, well manufactured and well installed as they may have to protect electronic equipment against extreme conditions including, but not limited to, hurricanes, fire, tornadoes and seismic vibrations.

Figure 2:
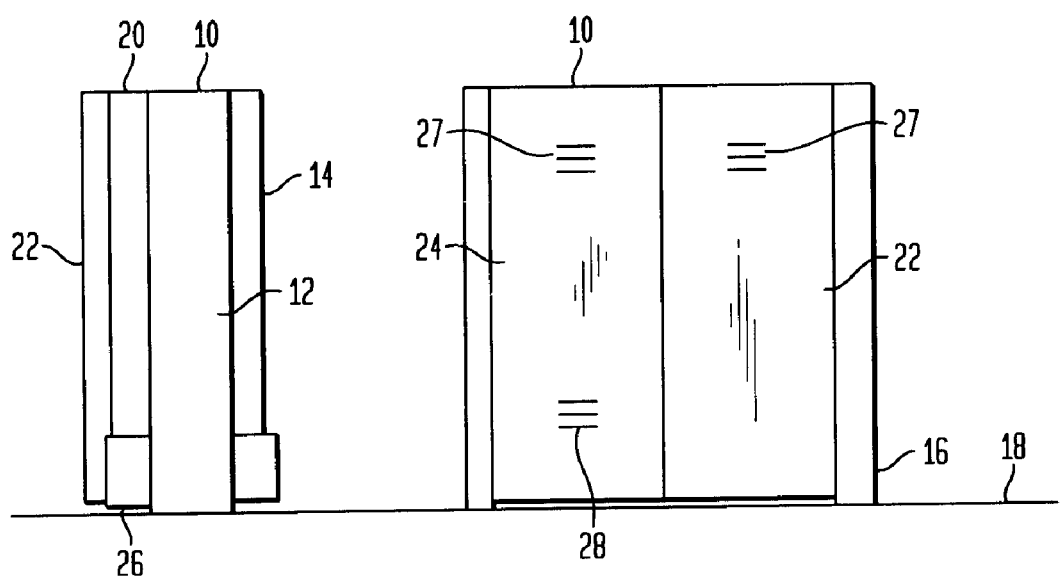
FIG. 2 shows a front and side elevation of a typical legacy cabinet fitted with the upgrade heat exchanger door and battery chamber modules of one embodiment of this invention.

FIG. 2 shows two elevations of a legacy cabinet 10 in which the legacy doors on one side of the cabinet 10 have been removed and replaced with the extension collar 20 and attached heat-exchanger doors 22 and 24. In the preferred embodiment of the invention there are two types of heat exchanger door, the heat exchanger and battery cooling door 22 and the heat exchanger only door 24. Heat exchanger doors 22 and 24 differ in the details of the airflow, as described below and seen by the differing arrangements of air intake grills 28 and air outlet grills 27. In addition, FIG. 2 shows a battery chamber 26 fitted as an upgrade module underneath the base of legacy cabinet 10.

In many legacy cabinets there is some space available where new equipment can be placed. The existing subscribers can then be transferred to the new equipment once it is installed. If there is no space available, existing batteries can be removed form the equipment compartment and the space freed up used to house the new equipment needed to accommodate existing subscribers. Because the new equipment has higher line densities, existing subscribers can be accommodated in a smaller area of the cabinet.

Figure 3:
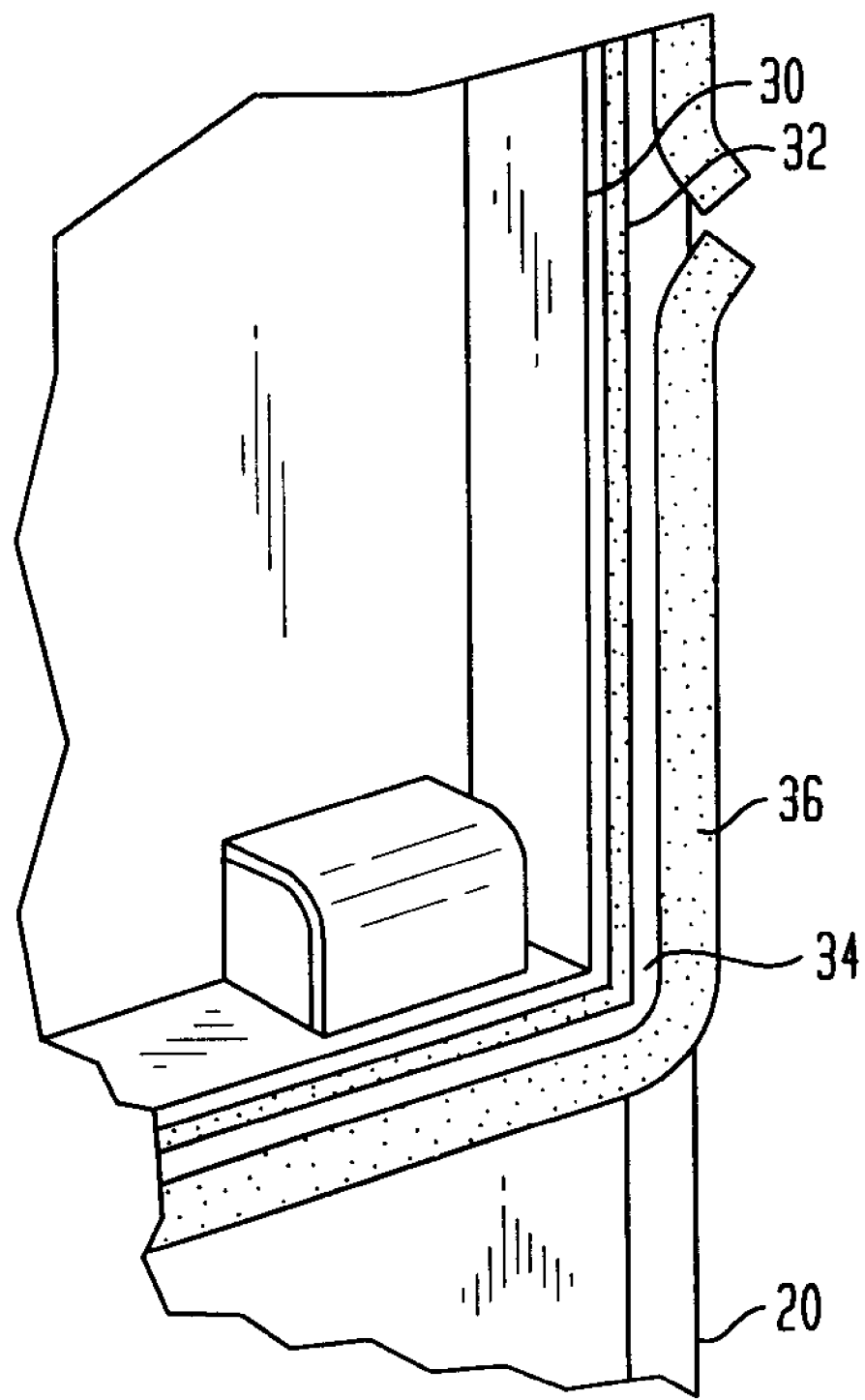
FIG. 3 shows a detail view of a portion of the extension collar, including flanges for both electromagnetic interference shielding gasket and weather shielding gaskets.

FIG. 3 shows a detailed view of a corner of an extension collar 20 of one embodiment of the invention, showing the flange for the Electromagnetic Interference (EMI) shielding gasket 30, the EMI shielding gasket 32, the flange for the weather or environmental gasket 34 and the weather gasket 36. Modern, high-speed electronics is a significant source of electromagnetic radiation. The EMI gasket is necessary to ensure a conduction seal between the door and the cabinet in order to contain the EMI emission to below FCC mandated levels. The area of the door that interfaces with the EMI gasket does not have paint. This ensures that there is electrical contact between the door and the EMI gasket. The EMI gasket may be made from materials such as, but not limited to, well-known electro-conductive polymers. However, such electro-conductive polymers, while being very effective EMI gaskets, are both expensive and do not hold up well to exposure to water. To protect both the EMI gasket and the components within the cabinet 10 from moisture, the preferred embodiment of the invention includes a weather or environmental gasket flange 34 and an appropriate weather sealing gasket 36. In one embodiment of the invention, the EMI suppression gasket is only needed on the horizontal portions, i.e. the top and bottom, of the EMI suppression gasket flanges, because the door attachment hinges are mounted on the outer sides of the extension collar and provide sufficient EMI shielding along those joints.

Figure 4:
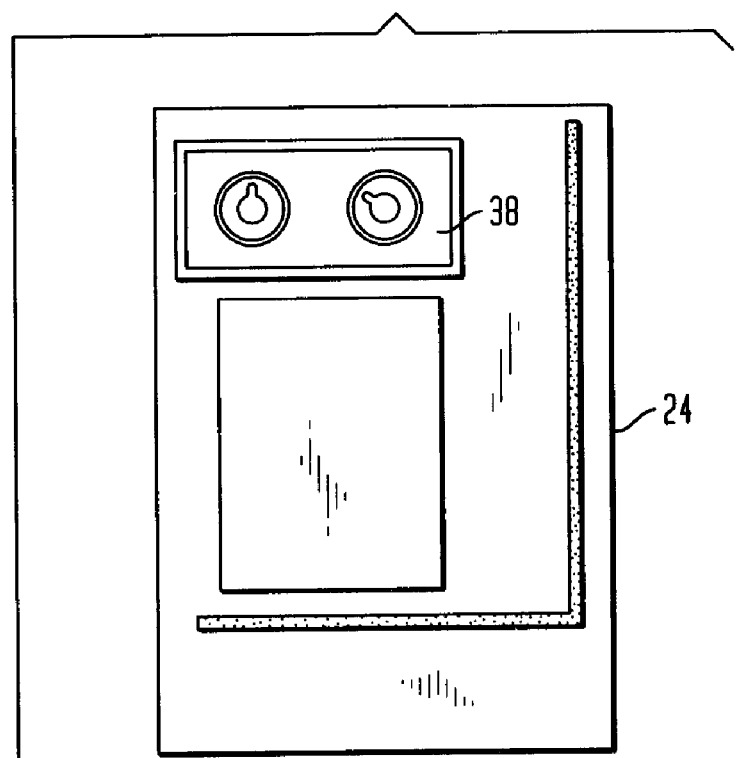
FIG. 4 shows inside views of two types of heat exchanger door including the fan assemblies.
Figure 4:
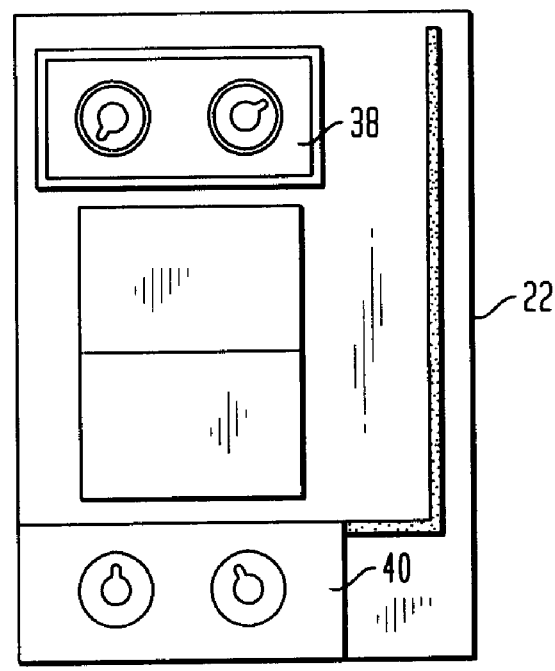
Figure 5:
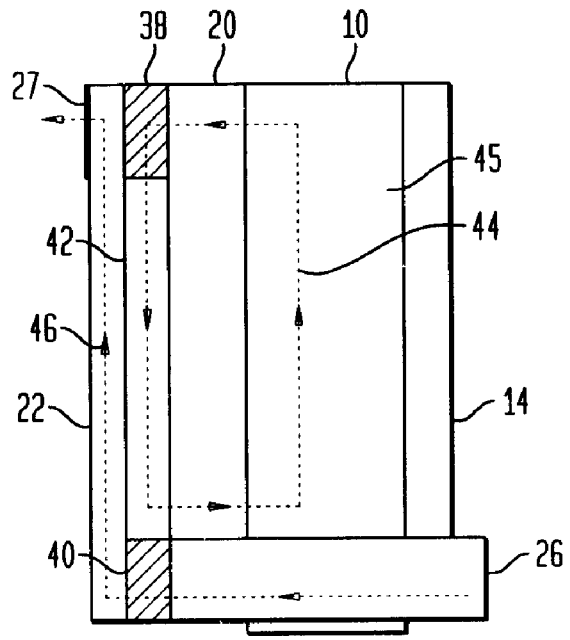
FIG. 5 shows the air circulation with a heat exchanger and battery-cooling door of one embodiment of this invention.

FIG. 4 shows the inside of heat exchanger doors 22 and 24 and the fan assemblies 38 and 40. Fan assemblies 38 and 40 may be suitable air moving device such as, but are not limited to, impeller fans for drawing air in. In the heat-exchanger-and-battery-cooling door 22 both the internal air intake fan unit 38 and the external air intake fan unit 40 are mounted on the same side of the door, thus enabling the external air to be drawn through battery. In contrast, the heat-exchanger-only door 24, has the internal air intake fan unit 38 mounted so as to draw air in from one side, while the external air intake fan unit (not shown in FIG. 4 for door 24) is mounted so as to draw air in from the other side of the same door FIG. 5 is a cross-sectional view of the heat-exchanger-and-battery-cooling door 22, showing the flow of internal air 44 and the flow of external air 46. In the preferred embodiment, the internal airflow 44 is driven by impeller fan 38 drawing heated air from the top of the cabinet equipment compartment 45. This air is then forced down past the inside face of heat-exchanger partition 42. Heat-exchanger partition 42 is made from a material having good heat conduction, such as but not limited to aluminum, copper or some suitable metal alloy. The heat-exchanger partition 42 may also be shaped to increase the surface area available to the air by for instance, but not limited to, extruding the membrane to have vertical fins, being made of corrugated aluminum sheet or simply being a flat sheet. The internal airflow 44 loses heat through the heat exchanger partition 42 to the external airflow 46. The internal airflow 44 flows back into the bottom of the cabinet equipment compartment 45, where it cools the racks of electronics contained in the cabinet.

The external airflow 46 is drawn into the door through the battery chamber 26 by external air intake fan unit 40. In passing through the battery chamber 26, the external airflow 46 both cools the batteries contained in the battery chamber 26 and vents them, removing any build up of hydrogen or other gases emitted by the batteries. Both the cooling and venting help prolong battery life. Fan unit 40, which may be, but is not limited to, an impeller fan, then forces the external airflow 46 up past the heat exchanger partition 42. Airflow 46 cools partition 42 and conveys the heat extracted up through air exit vent 27 into the environment. By this arrangement, the cabinet's equipment compartment 45 is cooled without any physical exchanger of air or other fluid, obviating any need for filtering and substantially reducing any risk of external contaminants damaging the electronics in the cabinet.

Figure 6:
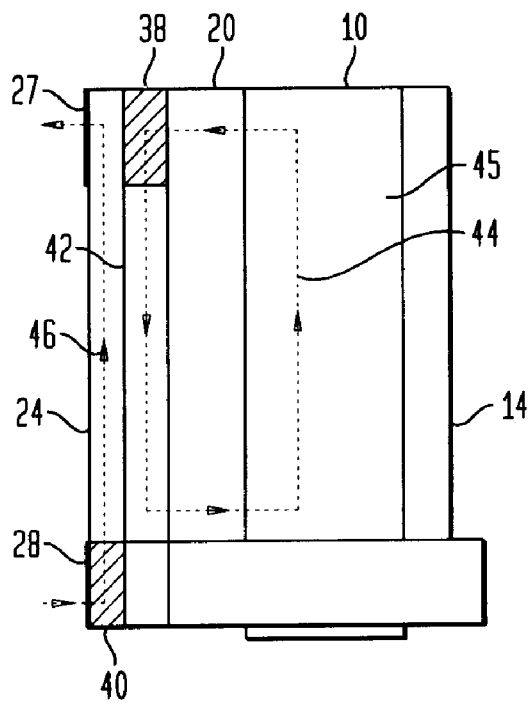
FIG. 6 shows the air circulation with a non-battery cooling heat exchanger door of this invention.

FIG. 6 shows the internal airflow 44 and external airflow 46 in a heat exchanger-only door 24 of the preferred embodiment of this invention. As before, the internal airflow 44 is driven by fan unit 38 drawing heated air from the top of the cabinet equipment compartment 45. This air is then forced down past the inside face of heat exchanger partition 42. The internal airflow 44 loses heat through the heat exchanger partition 42 to the external airflow 46. The internal airflow 44 flows back into the bottom of the cabinet equipment compartment 45, where it cools the racks of electronics contained in the cabinet. The external air flow 46 is drawn in through intake vents 28 by fan unit 40 and forced up passed heat exchanger partition 42. In passing partition 42, airflow 46 cools it by extracting heat. Heated airflow 46 then passes out thorough air exit vents 27 back into the surrounding air. The two airflows past the heat exchanger partition cool the telecommunications devices contained in the cabinet equipment compartment 45 without exchanger of air, thereby avoiding the need for filters and their associated maintenance problems. Heat exchangers also substantially reducing the problem of contaminants being introduced into the cabinet during cooling.

Figure 7:
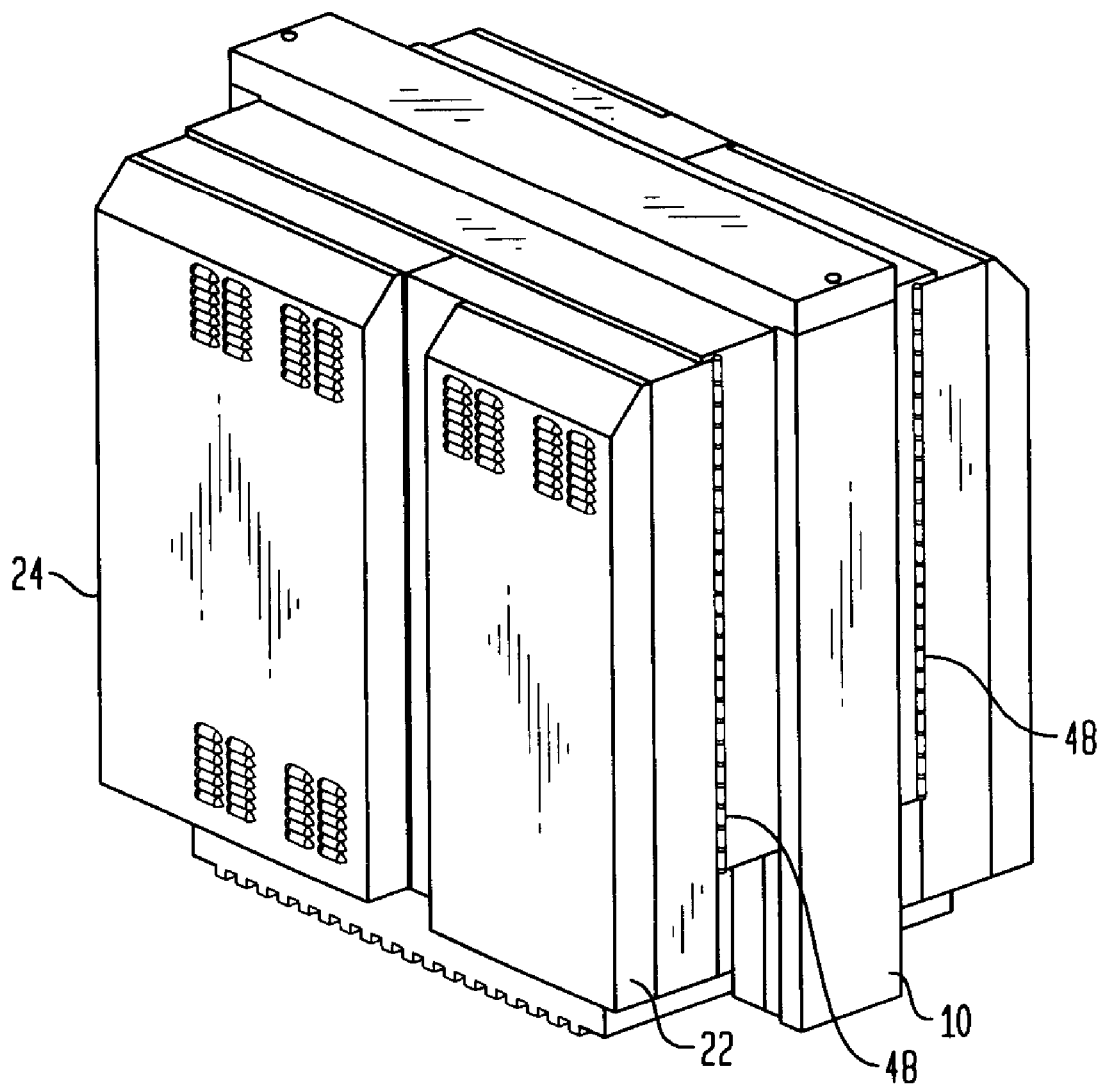
FIG. 7 shows an isometric view of a legacy cabinet having heat exchanger doors replacing all four original, legacy doors.

FIG. 7 shows an isometric view of a legacy cabinet 10 having heat exchanger doors 22 and 24 replacing all four original, legacy doors. FIG. 7 also shows door hinges 48. In one embodiment of the invention, door hinges 48 obviate the need for EMI shielding gasket 32 on the vertical sections of the EMI shielding gasket flanges 30 (not shown).

Figure 8:
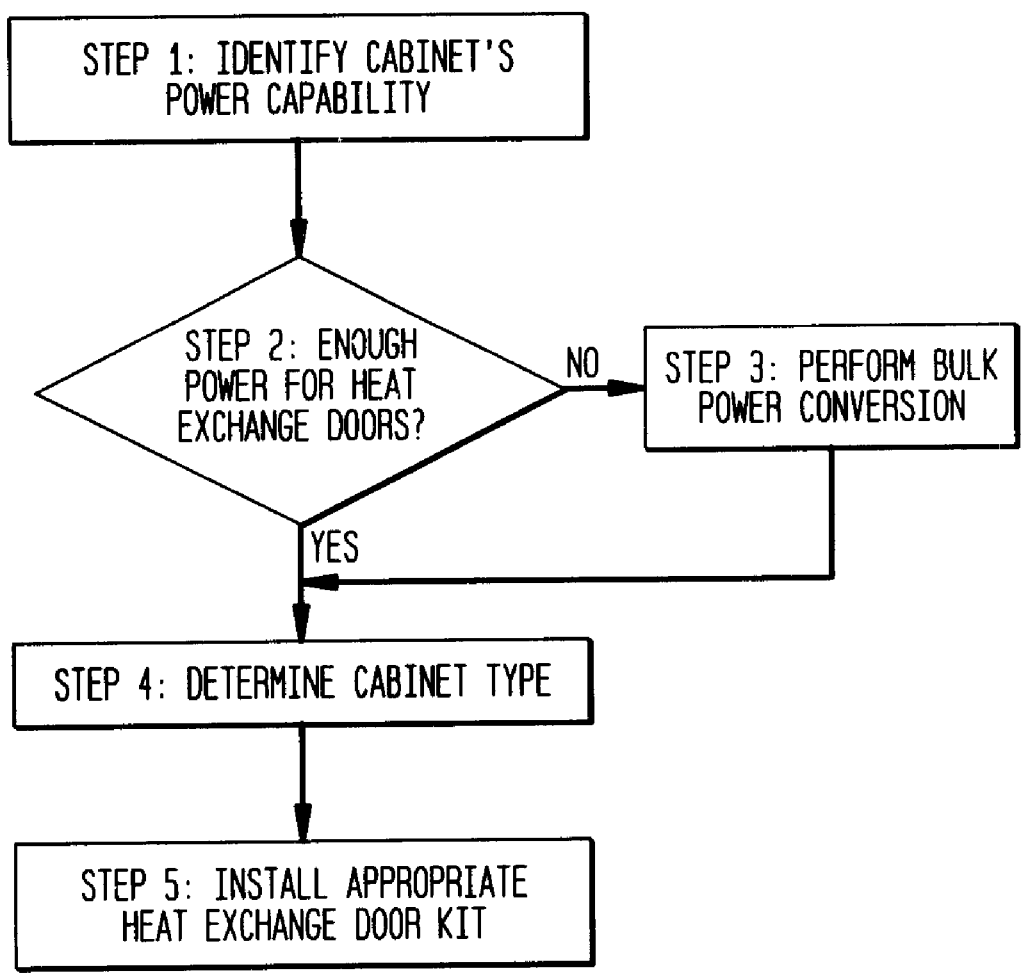
FIG. 8 is a flow chart showing the steps involved in one embodiment of the invention in which a cabinet cooling upgrade is implemented.

FIG. 8 is a flow chart showing the steps involved in one embodiment of the invention in which a cabinet cooling upgrade is implemented. Step 1 of the cabinet cooling upgrade is identifying the legacy cabinet's power capability. The heat exchanger doors of the preferred embodiment of this invention requires at least 6.6 amps of current at 54 V DC and 60 Amp-hr of battery for an 8 hour power reserve. If the legacy cabinet does not have these power capabilities available, then the installer proceeds to or plans for step 3, the step of performing a bulk power conversion first.

Once the legacy cabinet does have adequate power available, the next step in the heat exchanger upgrade process is to determine the specific cabinet type. This determination may be done by for instance, but is not limited to, measuring the legacy cabinet width or some other easily measured dimension. Amongst the common legacy cabinets are, for instance, the Avaya series of cabinets, including the 80C-DP cabinet and the 80D-DP cabinet. These can be distinguished from each other by the fact that the 80C-DP cabinet is 70 ¼ inches in width, while the 80D-DP cabinet is 76 ¼ inches in width. Once the cabinet type is determined, the appropriate Heat Exchanger Door kit can be ordered, delivered and fitted.

Figure 9A:
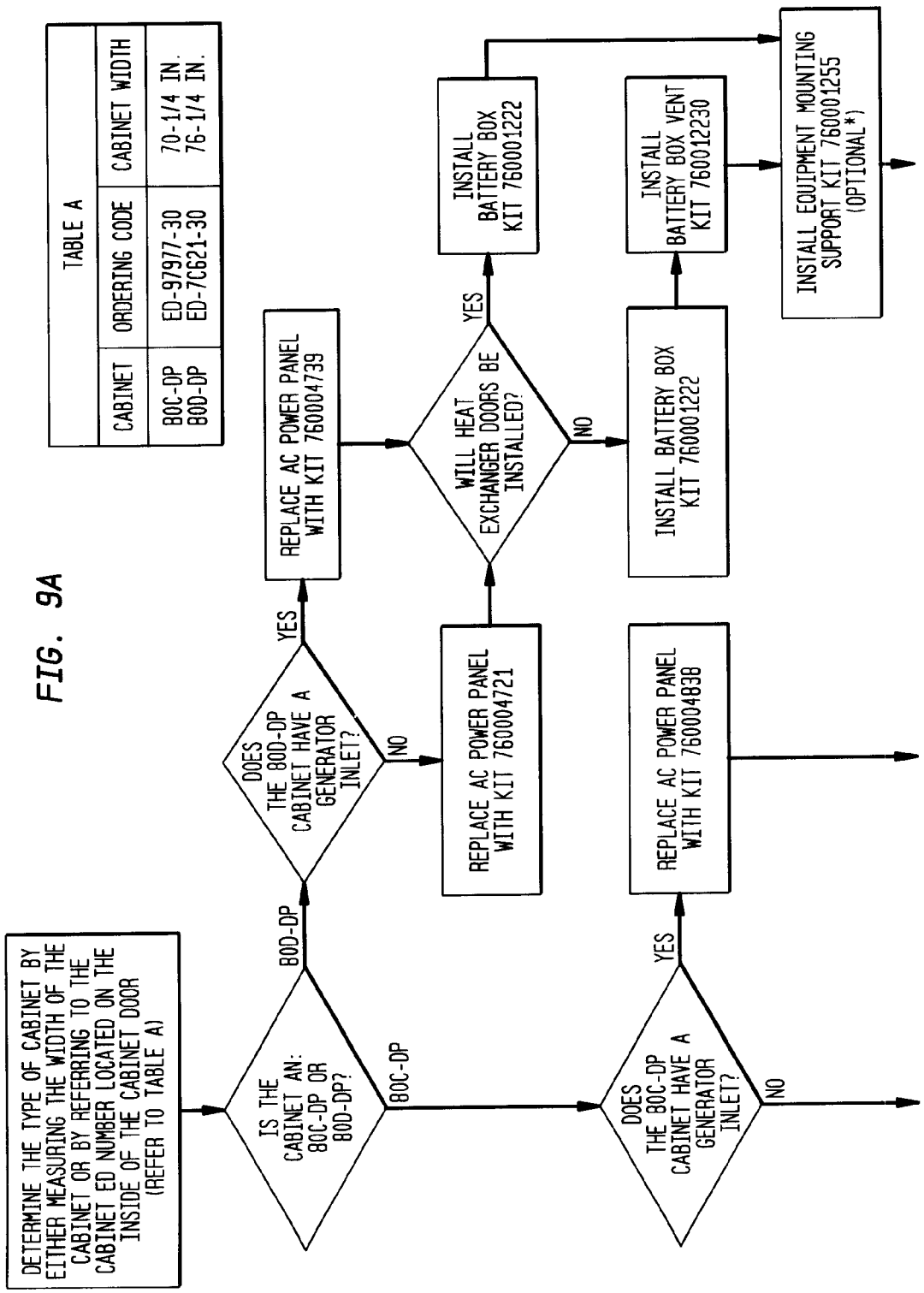
FIG. 9 is a flow chart showing the steps involved in one embodiment of the invention in which a bulk power conversion is implemented.

FIG. 9 is a flow chart showing the steps involved in one embodiment of the invention should a bulk power conversion be implemented. The flow chart of FIG. 9 shows the detailed chain of decisions made with respect to making a bulk power conversion to two specific Avaya cabinets, the 80C-DP cabinet and the 80D-DP cabinet. One of skill in the art will readily appreciate that a similar or related decision chain could be applied to any related cabinet capable of being upgraded in a similar fashion.

Although the invention has been described with reference to certain specific embodiments, various modifications thereof will be apparent to those skilled in the art without departing form the spirit or scope of the invention outlined in the claims appended hereto.

What is claimed is:

1. An upgrade module for a legacy telecommunications cabinet, comprising:
   at least one door;
   heat exchanger means attached to said at least one door, said heat exchanger means having a heat exchanging partition, said partition having an inner and an outer surface arranged such that an inner air flow past said inner surface flows in the opposing direction to an outer air flow past said outer surface with no mixing of said inner air flow and said outer air flow, thereby providing cooling for the interior of said cabinet without introducing air from the outside to the inside said cabinet; and,
   extension means fitted between said at least one door and said legacy cabinet, said extension means creating increased space within said cabinet whereby a replacement electronics rack longer than a legacy electronics rack can now replace said legacy electronics rack.

2. The upgrade module of claim 1, further comprising: electromagnetic interference-shielding means.

3. The upgrade module of claim 2, further comprising: weather-shielding means attached to said extension means.

4. The upgrade module of claim 3, wherein said cabinet is a raised cabinet, said upgrade further comprising:
   a battery chamber fitted beneath said cabinet.

5. The upgrade module of claim 4 wherein at least one of said heat exchanger means has means for venting and cooling said battery chamber.

6. The upgrade module of claim 1 wherein said heat exchanger means includes air moving means integrally attached to said doors.

7. The upgrade module of claim 2 wherein said electromagnetic interference-shielding means includes an electroconductive polymer gasket.

8. An upgrade module for a legacy telecommunications cabinet that contains an equipment compartment having a base section raised above ground level, comprising:
   at least one heat exchanger door, each of said heat exchanger doors including a first air inlet, a second air inlet, a first air outlet, a second air outlet, and a heat exchanger partition;
   an extension collar having a first and a second end, said first end being shaped to attach to said legacy cabinet and said second end being shaped to attach to said heat exchanger door, such that the extension collar creates increased space within said cabinet whereby a replacement electronics rack longer than a legacy electronics rack can now replace said legacy electronics rack, and wherein said second end of said extension collar is also shaped to include an electro-magnetic interference-shielding gasket flange and a weather-shielding gasket flange;
   an electro-magnetic interference-shielding gasket attached to said electromagnetic interference-shielding gasket flange;
   a weather-shielding gasket attached to said weather-shielding gasket flange; and
   a first fan and a second fan, wherein, when said heat exchanger doors are closed, said first fan draws a first stream of air from the equipment compartment of said cabinet through said first air inlet, past said heat exchanger partition in a first direction and through said first air outlet back into said equipment compartment, and wherein said second fan draws a second stream of air through said second air inlet from outside and from a level beneath said base section, past said heat exchanger partition in a direction opposite to first direction and through said second air outlet to outside said equipment compartment, thereby providing cooling without introducing air from outside into said equipment compartment and with no mixing of said first stream of air and said second stream of air.

9. The upgrade module of claim 8, wherein said first fan and said second fan are both integrally attached to said heat exchanger door.

10. The upgrade module of claim 8 further comprising a battery chamber shaped to fit beneath said base section.

11. The upgrade cabinet of claim 10 wherein said second air inlet of one of said heat exchanger doors is directed so as to draw air through said battery chamber, thereby providing venting and cooling for said battery chamber.

12. The upgrade module of claim 8 in which said heat exchanger partition is selected from the group consisting of an extruded aluminum sheet, a corrugated aluminum sheet and a flat metal sheet.

13. The upgrade module of claim 8 in which said electromagnetic interference-shielding gasket is comprised of an electro-conductive polymer.

14. The upgrade module of claim 8 in which said extension collar allows accommodation of electronics racks up to 16 inches in depth.

15. A method of upgrading a legacy telecommunications cabinet that has at least one existing door and contains an equipment compartment having a base section raised above ground level, said method comprising the steps of:

a) removing said at least one existing door;

b) attaching an extension collar to said cabinet;

c) fitting an electromagnetic interference-shielding gasket to said extension collar;

d) fitting a weather shielding gasket to said extension collar;

e) providing a first fan and a second fan; and f) closeably attaching at least one heat-exchanger door to said extension collar, thereby creating increased space within said cabinet whereby a replacement electronics rack longer than a legacy electronics rack can now replace said legacy electronics rack, wherein said at least one heat exchanger door includes a first air inlet, a second air inlet, a first air outlet, a second air outlet and a heat exchanger partition, and wherein, when said at least one heat exchanger door is closed, said first fan draws a first stream of air from said equipment compartment through said first air inlet, past said heat exchanger partition in a first direction and through said first air outlet back into said equipment compartment, and wherein said second fan draws a second stream of air through said second air inlet from outside and from a level beneath said base section, past said heat exchanger partition in a direction opposite to said first direction and through said second air outlet to outside said equipment compartment, thereby providing cooling without introducing air from outside into said equipment compartment and with no mixing of said first stream of air and said second stream of air.

16. The method of claim 15 wherein said first fan and said second fan are integrally attached to said at least one heat exchanger door.

17. The method of claim 15, further comprising the step of:

g) fitting a battery chamber beneath said base section; and wherein said second air inlet of said at least one heat exchanger door is directed so as to draw air from through said battery chamber, thereby providing venting and cooling for said battery chamber.

* * * * *